(12) United States Patent
Meynen et al.

(10) Patent No.: US 8,227,181 B2
(45) Date of Patent: Jul. 24, 2012

(54) METHOD OF PREPARING A PATTERNED FILM WITH A DEVELOPING SOLVENT

(75) Inventors: Herman C. G. D. C. Meynen, Lubbeek (BE); Brian Harkness, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 592 days.

(21) Appl. No.: 12/377,246

(22) PCT Filed: Aug. 8, 2007

(86) PCT No.: PCT/US2007/017624
§ 371 (c)(1),
(2), (4) Date: Feb. 11, 2009

(87) PCT Pub. No.: WO2008/021125
PCT Pub. Date: Feb. 21, 2008

(65) Prior Publication Data
US 2010/0178472 A1  Jul. 15, 2010

Related U.S. Application Data

(60) Provisional application No. 60/822,278, filed on Aug. 14, 2006.

(51) Int. Cl.
G03F 7/00 (2006.01)
G03F 7/26 (2006.01)
G03F 7/32 (2006.01)
G03F 7/40 (2006.01)

(52) U.S. Cl. .............. 430/331; 430/270.1; 430/317; 430/322; 430/330; 430/434; 430/435; 430/447

(58) Field of Classification Search ............. 430/270.1, 430/322, 317, 330, 331, 434, 435, 447
See application file for complete search history.

(56) References Cited

U.S. PATENT DOCUMENTS
2,676,182 A * 4/1954 Daudt et al. ............... 556/453
(Continued)

FOREIGN PATENT DOCUMENTS
JP  04-031864 A  2/1992
(Continued)

OTHER PUBLICATIONS

English language translation and abstract for JP 2738131 extracted from espacenet.com, translation from client, dated Jun. 8, 2009, 11 pages.
(Continued)

*Primary Examiner* — Amanda C. Walke
(74) *Attorney, Agent, or Firm* — Howard & Howard Attorneys PLLC

(57) ABSTRACT

A method of preparing a patterned film on a substrate includes applying a silicone composition onto a substrate to form a film of the silicone composition. A portion of the film is exposed to radiation to produce a partially exposed film having an exposed region and a non-exposed region. The partially exposed film is heated for a sufficient amount of time and at a sufficient temperature to substantially insolubilize the exposed region in a developing solvent that includes a siloxane component. The non-exposed region of the partially exposed film is removed with the developing solvent to reveal a film-free region on the substrate and to form the patterned film including the exposed region that remains on the substrate. The film-free regions is substantially free of residual silicone due to the presence of the siloxane component in the developing solvent.

13 Claims, 1 Drawing Sheet

U.S. PATENT DOCUMENTS

| | | | |
|---|---|---|---|
| 4,395,443 A * | 7/1983 | Shimizu et al. | 427/387 |
| 4,510,094 A | 4/1985 | Drahnak | |
| 4,510,176 A * | 4/1985 | Cuthbert et al. | 438/780 |
| 4,530,879 A | 7/1985 | Drahnak | |
| 4,584,355 A | 4/1986 | Blizzard et al. | |
| 4,585,836 A | 4/1986 | Homan et al. | |
| 4,591,622 A | 5/1986 | Blizzard et al. | |
| 5,454,970 A * | 10/1995 | Flaningam et al. | 510/177 |
| 5,496,961 A | 3/1996 | Dauth et al. | |
| 5,879,577 A * | 3/1999 | Weng et al. | 216/92 |
| 6,033,589 A * | 3/2000 | Lin | 216/92 |
| 6,255,228 B1 * | 7/2001 | Rolfson | 438/758 |
| 6,287,477 B1 | 9/2001 | Hacker et al. | |
| 6,617,674 B2 * | 9/2003 | Becker et al. | 257/678 |
| 7,517,808 B2 * | 4/2009 | Becker et al. | 438/745 |
| 7,803,358 B2 * | 9/2010 | Gordan et al. | 424/70.121 |

FOREIGN PATENT DOCUMENTS

| | | |
|---|---|---|
| JP | 2738131 B2 | 4/1998 |
| WO | WO 2005017627 A1 * | 2/2005 |

OTHER PUBLICATIONS

PCT International Search Report for PCT/US2007/017624, dated Feb. 21, 2008, 3 pages.

Article: Guo et al., "Highly Active Visible-Light Photocatalysts for Curing a Ceramic Precursor", Chemistry of Materials, 1998, No. 10, pp. 531-536.

Article: Meyer et al., "A New Approach to Wafer-Level Packaging Employs Spin-On and Printable Silicones", Chip Scale Review, 2004, 5 pages.

Brochure: Product Information, "Dow Corning OS-10, OS-20 OS-30, Fluids", Ref No. 10-1198-01, dated Jan. 5, 1998, 4 pages.

Flyer: Product Information, "Dow Corning WL-3010, WL-5150, WL-5350, WL-5351", Ref No. 11-1108-01, dated 2003, 3 pages.

English language abstract for JP 04-031864, dated Feb. 4, 2009, 4 pages.

* cited by examiner

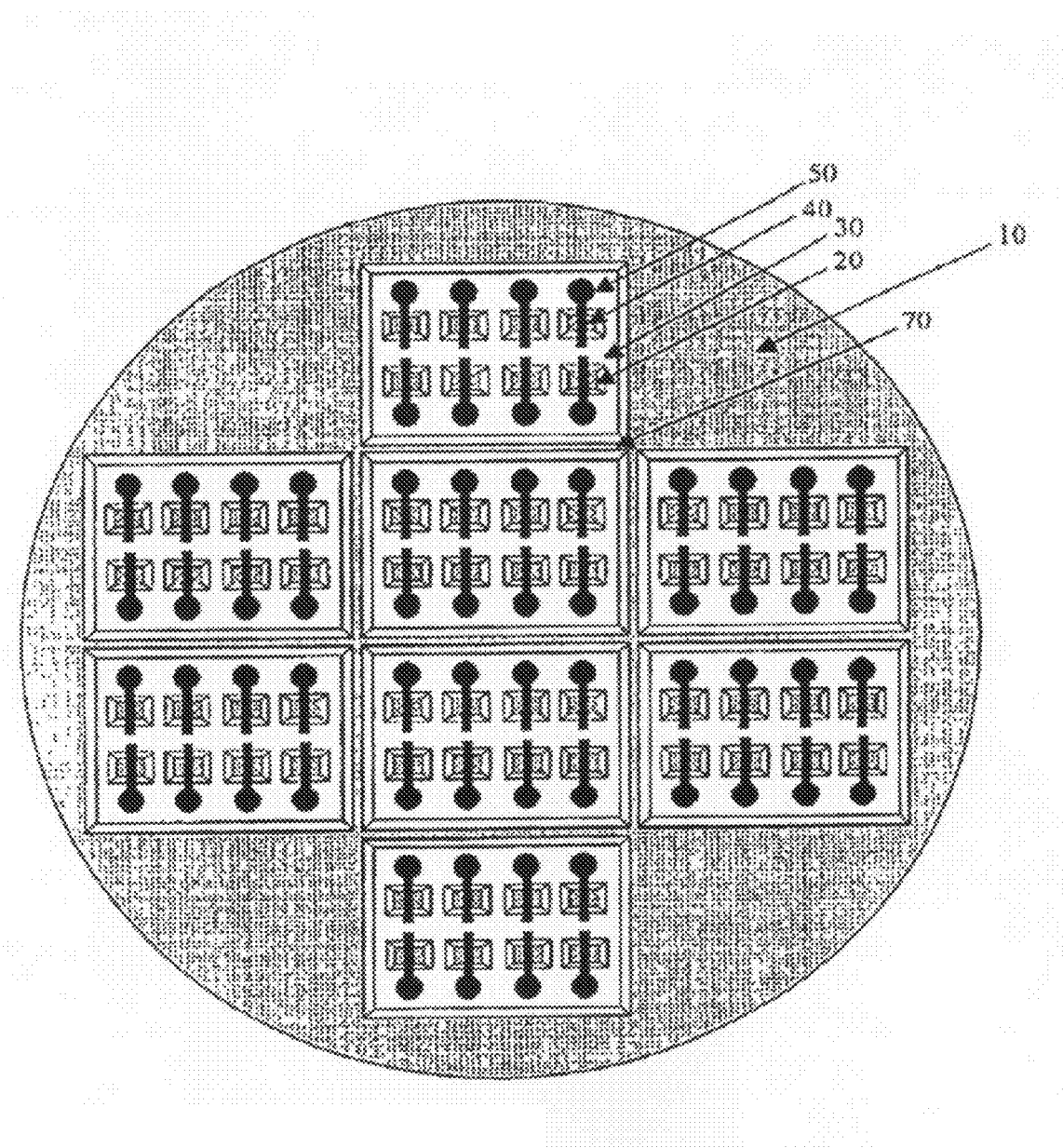

METHOD OF PREPARING A PATTERNED FILM WITH A DEVELOPING SOLVENT

RELATED APPLICATIONS

This application claims priority to and all the advantages of International Patent Application No. PCT/US2007/017624, filed on Aug. 8, 2007, which claims priority to U.S. Provisional Patent Application No. 60/822,278, filed on Aug. 14, 2006.

FIELD OF THE INVENTION

The present invention generally relates to a method of preparing a patterned film. More specifically, the invention relates to a method of preparing a patterned film on a substrate including a film-free region that is substantially free of residual silicone after development.

BACKGROUND OF THE INVENTION

Patterned films formed from silicone compositions are used for many applications in the field of electronics, and are particularly useful in the fabrication of integrated circuit chips, optical devices, and MEMS devices. In particular, the patterned films are used for wafer level packaging applications on top of integrated circuits. The patterned films provide several important functions, including dielectric, mechanical and environmental protection. In addition, the patterned films act as a mechanism for redistribution of the connections from the tight pitch (center to center spacing between bond pads) on the integrated circuit chips to the relatively wide pitch required by printed circuit board manufacturers. Further, the patterned films enable stress release in the integrated circuit chips.

Methods of preparing the patterned films include applying the silicone composition onto the substrate to form a film of the silicone composition. After a soft-bake step, a portion of the film is exposed to radiation, typically by placing a photomask having a desired pattern over the film, to produce a partially exposed film that has an exposed region and a non-exposed region. The partially exposed film is then heated for a sufficient amount of time and at a sufficient temperature to substantially insolubilize the exposed region in a developing solvent, with the non-exposed region remaining soluble in the developing solvent. The non-exposed region of the partially exposed film is then removed with the developing solvent to reveal a film-free region and to form the patterned film. The patterned film includes the exposed region that remains on the substrate.

In conventional methods, the film-free region retains residual silicone after removal of the non-exposed region when conventional developing solvents are used. Conventional developing solvents typically include aliphatic hydrocarbon-based solvents, such as Negative Resist Developer (NRD) commercially available from Air Products and Chemicals, Inc. of Allentown, Pa. Other examples of conventional developing solvents include methyl isobutyl ketone, methyl ethyl ketone, n-butyl ether, polyethylene glycol monomethylether, ethyl acetate, y-butyrolactone, nonane, decalin, dodecane, mesitylene, xylene, and toluene.

The residual silicone left on the film-free region affects the performance of the integrated circuits and must be removed. Plasma etching using a fluorine-based plasma is typically used to remove the residual silicone left on the film-free region. Excessive use of fluorine plasma can have negative effects on the integrated circuits. In particular, the fluorine-based plasma degrades PECVD silicon nitride, which may be present on the substrate, as well as other etch-sensitive structures on the substrate. As such, it would be advantageous to reduce or eliminate the presence of residual silicone on the film-free region in order to reduce or eliminate excessive plasma etching that is required to remove the residual silicone.

SUMMARY OF THE INVENTION AND ADVANTAGES

The present invention provides a method of preparing a patterned, film on a substrate and an article including the patterned film disposed on the substrate. For the method, a silicone composition is applied onto the substrate to form a film of the silicone composition. A portion of the film is exposed to radiation to produce a partially exposed film having an exposed region and a non-exposed region. The partially exposed film is heated for a sufficient amount of time and at a sufficient temperature to substantially insolubilize the exposed region in a developing solvent that includes a siloxane component. The non-exposed region remains soluble in the developing solvent. The non-exposed region of the partially exposed film is removed with the developing solvent to reveal a film-free region and to form the patterned film. The patterned film includes the exposed region that remains on the substrate. The film-free region of the substrate is substantially free of residual silicone due to the presence of the siloxane component in the developing solvent.

Due to the substantial absence of residual silicone on the film-free region of the substrate, less plasma etching is required as compared to when conventional developing solvents are used, resulting in decreased production times and a lower Cost of Ownership.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 1 is a schematic view of a wafer including a plurality of integrated circuit chips according to one embodiment of the present invention.

DETAILED DESCRIPTION OF THE PREFERRED EMBODIMENTS

An article includes a substrate and a patterned film disposed on the substrate. More specifically, in one embodiment, the article is a semiconductor device including an integrated circuit chip, a plurality of which are shown in FIG. 1 and disclosed in U.S. Pat. No. 6,617,674, the disclosure of which is hereby incorporated by reference. Although a semiconductor device is one suitable embodiment of the article of the present invention, it is to be appreciated that the article may be any substrate having a patterned film prepared thereon in accordance with a method of the present invention, and may have other uses than in electronics such as in nanopatterning applications, photonics applications, solar applications, display applications, MEMS applications, etc.

The semiconductor package including the integrated circuit chip more specifically includes a wafer 10, i.e., the substrate, having several dies with at least one integrated circuit, and may have at least two integrated circuits as shown in FIG. 1. The wafer 10 is formed from a semiconductor material. Typical semiconductor materials include silicon, silicon carbide, germanium, gallium nitride and gallium arsenide. However, the wafer 10 may be formed from any manner of materials that are known in the art for forming wafers, such as plastics or glass. Specific examples of integrated circuits include, but are not limited to, DRAM, FLASH, SRAM, and LOGIC devices. Additionally, PECVD silicon nitride structures may also be present on the substrate.

Each integrated circuit has a plurality of bond pads 20, i.e., I/O terminals, which are typically located on a periphery of the integrated circuit. The number of bond pads 20 per integrated circuit can range from about 4 to more than 2,000, depending on the complexity of the integrated circuit. The bond pads 20 are made of an electrically conductive metal, typically aluminum, copper, or alloys thereof. In the integrated circuits, the patterned film 30 either partially or completely covers the active surface of the wafer 10 while leaving at least a portion of each bond pad 20 uncovered. In addition, the integrated circuit typically includes a metal trace 40 having a proximal end attached to each bond pad 20 and a distal end lying on the surface of the patterned film 30. A solder bump 50 is typically attached to the distal end of each metal trace 40. The wafer 10 may further include streets 70.

For the method of preparing the patterned film 30, a silicone composition is applied onto the substrate to form a film of the silicone composition. The silicone composition includes an organopolysiloxane having an average of at least two silicon-bonded alkenyl groups per molecule, an organosilicon having an average of at least two silicon-bonded hydrogen atoms per molecule in an amount sufficient to cure the composition, and a hydrosilylation catalyst.

The organopolysiloxane can be a homopolymer or a copolymer and can have either a linear, branched, or resinous structure. The alkenyl groups typically have from 2 to about 10 carbon atoms and are exemplified by, but not limited to, vinyl, allyl, butenyl, and hexenyl. The alkenyl groups in the organopolysiloxane may be located at terminal, pendant, or both terminal and pendant positions. The remaining silicon-bonded organic groups in the organopolysiloxane are independently selected from monovalent hydrocarbon and monovalent halogenated hydrocarbon groups free of aliphatic unsaturation. The monovalent hydrocarbon groups typically have from 1 to about 20 carbon atoms, more typically from 1 to about 10 carbon atoms, and are exemplified by, but are not limited to, alkyl groups such as methyl, ethyl, propyl, pentyl, octyl, undecyl, and octadecyl; cycloalkyl groups such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Typically, at least 50 percent, and more typically at least 80 percent, of the monovalent hydrocarbon and monovalent halogenated hydrocarbon groups free of aliphatic unsaturation in the organopolysiloxane are methyl groups.

Specific examples of organopolysiloxanes useful in the silicone composition include, but are not limited to, polydiorganosiloxanes having the following formulae: $ViMe_2SiO(Me_2SiO)_aSiMe_2Vi$, $ViMe_2SiO(Me_2SiO)_{0.25a}(MePhSiO)_{0.75a}SiMe_2Vi$, $ViMe_2SiO(Me_2SiO)_{0.95a}(Ph_2SiO)_{0.05a}SiMe_2Vi$, $ViMe_2SiO(Me_2SiO)_{0.98a}(MeViSiO)_{0.02a}SiMe_2Vi$, $Me_3SiO(Me_2SiO)_{0.95a}(MeViSiO)_{0.05a}SiMe_3$, and $PhMeViSiO(Me_2SiO)_aSiPhMeVi$, where Me, Vi, and Ph denote methyl, vinyl, and phenyl groups, respectively, and have a value such that the viscosity of the polydiorganosiloxane at 25° C. is from 0.001 to 100,000 Pa·s. Alternatively, the viscosity of the polydiorganosiloxane is from 0.01 to 10,000 Pa·s, alternatively from 0.01 to 1,000 Pa·s. Methods of preparing organopolysiloxanes suitable for use in the silicone composition, such as hydrolysis and condensation of the corresponding organohalosilanes or equilibration of cyclic polydiorganosiloxanes, are well known in the art.

When the organopolysiloxanes are resinous in form, suitable examples of organopolysiloxane resins for purposes of the present invention include an MQ resin comprising $R^1_3SiO_{1/2}$ units and $SiO_{4/2}$ units, a TD resin comprising $R^1SiO_{3/2}$ units and $R^1_2SiO_{2/2}$ units, an MT resin comprising $R^1_3SiO_{1/2}$ units and $R^1SiO_{3/2}$ units, and an MTD resin comprising $R^1_3SiO_{1/2}$ units, $R^1SiO_{3/2}$ units, and $R^1_2SiO_{2/2}$ units, wherein each $R^1$ is independently selected from the group of monovalent hydrocarbon groups, monovalent halogenated hydrocarbon groups, and combinations thereof. The monovalent groups represented by $R^1$ typically have from 1 to about 20 carbon atoms, alternatively from 1 to about 10 carbon atoms. The monovalent hydrocarbon groups and the monovalent halogenated hydrocarbon groups may be the same as those described above. Typically, at least one-third of the $R^1$ groups, alternatively substantially all $R^1$ groups in the organopolysiloxane resin, are methyl. One specific example of an organopolysiloxane resin that is suitable for purposes of the present invention comprises $(CH_3)_3SiO_{1/2}$ siloxane units and $SiO_{4/2}$ wherein the mole ratio of $(CH_3)_3SiO_{1/2}$ units to $SiO_{4/2}$ units is from 0.6 to 1.9.

Typically, the organopolysiloxane resin has an average of from 3 to about 30 mole percent of alkenyl groups. The mole percent of alkenyl groups in the organopolysiloxane resin is defined herein as the ratio of the number of moles of alkenyl-containing siloxane units in the organopolysiloxane resin to the total number of moles of siloxane units in the organopolysiloxane resin, multiplied by 100.

The organopolysiloxane resins can be prepared by methods well-known in the art. Typically, the organopolysiloxane resin is prepared by treating a resin copolymer produced by a silica hydrosol capping process of Daudt et al. with at least an alkenyl-containing endblocking reagent. The method of Daudt et al. is disclosed in U.S. Pat. No. 2,676,182, the disclosure of which is hereby incorporated by reference to teach how to make organopolysiloxane resins suitable for use in the present invention.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally include from about 2 to about 5 percent by weight hydroxyl groups, based on the total weight of the copolymer.

The organopolysiloxane resin, which typically includes less than 2 percent by weight of silicon-bonded hydroxyl groups, based on the total weight of the organopolysiloxane resin, can be prepared by reacting the copolymer prepared by the process of Daudt et al. with an alkenyl-containing endblocking agent or a mixture of an alkenyl-containing endblocking agent and an endblocking agent free of aliphatic unsaturation in an amount sufficient to provide from 3 to about 30 mole percent of alkenyl groups in the final product. Examples of endblocking agents include, but are not limited to, silazanes, siloxanes, and silanes. Suitable endblocking agents are known in the art and exemplified in U.S. Pat. No. 4,584,355 to Blizzard et al.; U.S. Pat. No. 4,591,622 to Blizzard et al.; and U.S. Pat. No. 4,585,836 to Homan et al., the disclosures of which are hereby incorporated by reference. A single endblocking agent or a mixture of such agents can be used to prepare the organopolysiloxane.

The silicone composition may include a single organopolysiloxane or a mixture comprising two or more organopolysiloxanes, including organopolysiloxane resins, that differ in at least one of the following properties: structure, viscosity, average molecular weight, siloxane units, and sequence.

The organosilicon has an average of at least two silicon-bonded hydrogen atoms per molecule. It is generally appreciated by those of skill in the art that crosslinking occurs when the sum of the average number of alkenyl groups per molecule in the organopolysiloxane and the average number of silicon-bonded hydrogen atoms per molecule in the organosilicon is greater than four. The silicon-bonded hydrogen atoms in the organosilicon can be located at terminal, pendant, or at both terminal and pendant positions.

The organosilicon may be selected from the group of organosilanes, organohydrogensiloxanes, and combinations thereof. The organosilane can be a monosilane, disilane, trisilane, polysilane, or a combination thereof. Similarly, the organohydrogensiloxane can be a disiloxane, trisiloxane, polysiloxane, or combination thereof. Typically, the organosilicon is an organohydrogensiloxane such as, for example, an organohydrogenpolysiloxane. The structure of the organosilicon can be linear, branched, cyclic, or resinous. Typically, at least 50 percent of the organic groups in the organosilicon are methyl.

Specific examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene)methylene.

Specific examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated a trimethylsiloxy-terminated poly(dimethylsiloxane/methylhydrogensiloxane), a dimethylhydrogensiloxy-terminated poly(methylhydrogensiloxane), and a organohydrogensiloxane resin comprising $H(CH_3)_2SiO_{1/2}$ units, $(CH_3)_3SiO_{1/2}$ units, and $SiO_{4/2}$ units.

The organosilicon can be a single organosilicon or a mixture comprising two or more such organosilicons, including organosilicon resins, that differ in at least one of the following properties: structure, average molecular weight, viscosity, silane units, siloxane units, and sequence.

The organosilicon is present in the silicone composition in an amount sufficient to cure, i.e., crosslink, the silicone composition. The exact amount of the organosilicon depends on the desired extent of cure, which generally increases as the ratio of the number of moles of silicon-bonded hydrogen atoms in the organosilicon to the number of moles of alkenyl groups in the organopolysiloxane increases. Typically, the concentration of the organosilicon is sufficient to provide from 0.5 to 3 silicon-bonded hydrogen atoms per alkenyl group in the organopolysiloxane. Typically, the organosilicon is present in a sufficient amount to provide from 0.7 to 1.2 silicon-bonded hydrogen atoms per alkenyl group in the organopolysiloxane.

Methods of preparing organosilicons containing silicon-bonded hydrogen atoms, i.e., organosilanes such as organopolysilanes, are well known in the art. For example, organopolysilanes can be prepared by reaction of chlorosilanes in a hydrocarbon solvent in the presence of sodium or lithium metal (Wurtz reaction).

To ensure compatibility of the organopolysiloxane and the organosilicon, the predominant organic group in both the organopolysiloxane and the organosilicon may be the same. The predominant organic group is typically methyl.

The hydrosilylation catalyst is typically capable of photoactivation. The hydrosilylation catalyst can be any hydrosilylation catalyst capable of catalyzing the hydrosilylation of the organopolysiloxane and the organosilicon upon exposure to radiation having a wavelength of from 150 to 800 nm and subsequent heating. Suitable hydrosilylation catalysts, for purposes of the present invention, are typically based on a platinum group metal. The platinum group metals include platinum, rhodium, ruthenium, palladium, osmium and iridium. Typically, the platinum group metal is platinum, based on its high activity in hydrosilylation reactions.

Specific examples of hydrosilylation catalysts that are suitable for purposes of the present invention include, but are not limited to, platinum(II) β-diketonate complexes such as platinum(II) bis(2,4-pentanedioate), platinum(II) bis(2,4-hexanedioate), platinum(II) bis(2,4-heptanedioate), platinum(II) bis(1-phenyl-1,3-butanedioate, platinum(II) bis(1,3-diphenyl-1,3-propanedioate), platinum(II) bis(1,1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp)triethylplatinum, (chloro-Cp)trimethylplatinum, and (trimethylsilyl-Cp)trimethylplatinum, where Cp represents cyclopentadienyl; triazene oxide-transition metal complexes, such as $Pt[C_6H_5NNNOCH_3]_4$, $Pt[p-CN—C_6H_4NNNOC_6H_{11}]_4$, $Pt[p-H_3COC_6H_4NNNOC_6H_{11}]_4$, $Pt[p-CH_3(CH_2)_x—C_6H_4NNNOCH_3]_4$, 1,5-cyclooctadiene.$Pt[p-CN—C_6H_4\ NN\ NO\ C_6H_{11}]_2$, 1,5-cyclooctadiene.$Pt[p-CH_3O—C_6H_4\ NNN\ OC\ H_3]_2$, $[(C_6H_5)_3P]_3Rh[p-CN—C_6H_4NNNOC_6H_{11}]$, and $Pd[p-CH_3(CH_2)_x—C_6H_4NNNOCH_3]_2$, where x is 1, 3, 5, 11, or 17; (η-diolefin)(σ-aryl)platinum complexes, such as ($η^4$-1,5-cyclooctadienyl)diphenylplatinum, $η^4$-1,3,5,7-cyclooctatetraenyl)diphenylplatinum, ($η^4$-2,5-norboradienyl)diphenylplatinum, ($η^4$-1,5-cyclooctadienyl)bis-(4-dimethylaminophenyl)platinum, ($η^4$-1,5-cyclooctadienyl)bis-(4-acetylphenyl)platinum, and ($η_1^4$-1,5-cyclooctadienyl)bis-(4-trifluoromethylphenyl)platinum. In one specific embodiment, the photoactivated hydrosilylation catalyst is a Pt(II) β-diketonate complex such as platinum(II) bis(2,4-pentanedioate). The hydrosilylation catalyst can be a single photoactivated hydrosilylation catalyst or a mixture comprising two or more such catalysts.

The concentration of the hydrosilylation catalyst in the silicone composition is sufficient to catalyze the addition reaction of the organopolysiloxane and the organosilicon upon exposure to radiation and heat in the method described below. Typically, the concentration of the hydrosilylation catalyst is sufficient to provide from 0.1 to 1000 ppm of platinum group metal, alternatively from 0.5 to 100 ppm of platinum group metal, alternatively from 1 to 25 ppm of platinum group metal, based on the combined parts of the organopolysiloxane, the organosilicon, and the hydrosilylation catalyst.

Methods of preparing the preceding hydrosilylation catalysts are known in the art. For example, methods of preparing platinum(II) β-diketonates are reported by Guo et al. (Chemistry of Materials, 1998, 10, 531-536). Methods of preparing (η-cyclopentadienyl)trialkylplatinum complexes are disclosed in U.S. Pat. No. 4,510,094. Methods of preparing triazene oxide-transition metal complexes are disclosed in U.S. Pat. No. 5,496,961. Methods of preparing (η-diolefin)(σ-aryl)platinum complexes are taught in U.S. Pat. No. 4,530,879.

The silicone composition may begin to cure at ambient temperature. To obtain a longer working time or "pot life", the activity of the hydrosilylation catalyst under ambient conditions can be retarded or suppressed by the addition of a suitable inhibitor to the silicone composition. A platinum catalyst inhibitor retards curing of the silicone composition at ambient temperature, but does not prevent the composition from curing at elevated temperatures. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes. Acetylenic alcohols constitute a preferred class of inhibitors in the silicone composition for purposes of the present invention.

The concentration of platinum catalyst inhibitor in the silicone composition is sufficient to retard curing of the silicone composition at ambient temperature without preventing or excessively prolonging cure at elevated temperatures. The concentration of the hydrosilylation catalyst will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. The optimum concentration for a particular inhibitor in a given silicone composition can be readily determined by those of skill in the art.

The silicone composition may also include additional ingredients, provided the ingredients do not adversely affect photopatterning or cure of the silicone composition. Examples of additional ingredients include, but are not limited to, adhesion promoters, solvents, inorganic fillers, photosensitizers, and surfactants.

The silicone composition may further include an appropriate quantity of at least one organic solvent to lower the viscosity of the silicone composition and facilitate the preparation, handling, and application of the silicone composition. Examples of suitable solvents include, but are not limited to, saturated hydrocarbons having from 1 to about 20 carbon atoms; aromatic hydrocarbons such as xylenes and mesitylene; mineral spirits; halohydrocarbons; esters; ketones; silicone fluids such as linear, branched, and cyclic polydimethylsiloxanes; and mixtures of such solvents. The optimum concentration of a particular solvent in the silicone composition can be readily determined by those of skill in the art.

The silicone composition can be a one-part composition comprising the organopolysiloxane, the organosilicon, and the hydrosilylation catalyst in a single part or, alternatively, a multi-part composition comprising the organopolysiloxane, the organosilicon, and the hydrosilylation catalyst in two or more parts. In the multi-part silicone compositions, the organopolysiloxane, the organosilicon, and the hydrosilylation catalyst are typically not present in the same part unless an inhibitor is also present. For example, a multi-part silicone composition can comprise a first part containing a portion of the total amount of the organopolysiloxane and a portion of the total amount of the organosilicon and a second part containing the remaining portions of the organopolysiloxane and organosilicon and the hydrosilylation catalyst.

The one-part silicone composition is typically prepared by combining the organopolysiloxane, the organosilicon, and the hydrosilylation catalyst and any optional ingredients in the stated proportions at ambient temperature with or without the aid of a solvent, which is described above. Although the order of addition of the various components is not critical if the silicone composition is to be used immediately, the hydrosilylation catalyst is typically added last at a temperature of less than or equal to about 30° C. to prevent premature curing of the silicone composition. Also, the multi-part silicone composition can be prepared by combining the particular components designated for each part.

A method of preparing the article of the present invention includes the step of applying the silicone composition onto the substrate to form a film of the silicone composition. The silicone composition can be applied onto the substrate using any conventional method, such as spin coating, dipping, spraying, slit, or screen printing. The silicone composition may be applied by spin coating at a speed of from 300 to 6,000 rpm for a period of from 5 to 90 seconds. The volume of silicone composition applied in the spin coating method is dependent upon a size of the substrate and is typically from 1 to 10 ml. The spin speed, spin time, and volume of silicone composition can be adjusted to produce a cured silicone film having a thickness of from 0.05 to 200 µm.

When the silicone composition comprises the solvent, as described above, the method may further include the step of removing at least a portion of the solvent from the film on the substrate. Typically, the solvent is removed by heating the film at a temperature of from 50 to 150° C. for a period of from 1 to 5 minutes. Alternatively, the solvent is removed by heating the film at a temperature of from 80 to 120° C. for a period of from 2 to 4 minutes.

After removing the solvent from the film on the substrate, if necessary, edge beads of the film are removed from the substrate with an edge bead-removal (EBR) solvent. The edge beads build up during application of the silicone composition onto the substrate and are typically removed to prevent undesirable contact of the film with wafer processing equipment. The EBR solvent is typically the same as a developing solvent, as described in further detail below, which provides many advantages to the method of preparing the patterned film 30 on the substrate since different solvents are not required for removal of edge beads and for development.

After removing the edge beads, the film of the silicone composition on the substrate is typically subjected to a soft-bake step, as known in the art. After the soft-bake step, a portion of the film is exposed to radiation to produce a partially exposed film having an exposed region and a non-exposed region. The radiation initiates crosslinking in the exposed region to form a crosslinked polymer, while the non-exposed region remains uncrosslinked. When the article is the wafer 10 including the integrated circuit, the non-exposed region covers at least a portion of each bond pad, and the exposed region may cover the remainder of the active surface of the wafer 10. In addition to pattern features dictated by device requirements, the wafer 10 may comprise scribe lines, as alluded to above. When the wafer 10 further comprises scribe lines, the film overlying the lines is typically not exposed to radiation.

The radiation is typically provided by a light source, such as a medium pressure 1000 Watt mercury-arc lamp. The radiation typically has a wavelength of from 150 to 450 nm, more typically from 250 to 450 nm. The dose of radiation is typically from 0.1 to 5,000 mJ/cm$^2$, more typically from 250 to 1,300 mJ/cm$^2$. Exposure of the film to radiation is typically controlled through a photomask having a pattern of images, with the photomask selectively blocking or transmitting the radiation based on the pattern of images thereon in order to produce the exposed region or to prevent exposure of the unexposed region.

The partially exposed film is heated for a sufficient amount of time and at a sufficient temperature to substantially insolubilize the exposed region in the developing solvent, to be described in further detail below. The unexposed region is soluble in the developing solvent. The term "substantially insoluble" means that the exposed region of the silicone film is not removed by dissolution in the developing solvent to the extent that the underlying surface of the substrate is exposed. The term "soluble" means that the unexposed region of the film is removed by dissolution in the developing solvent, exposing the underlying surface of the substrate, which is typically a primary passivation of the wafer 10.

In order to substantially insolubilize the exposed region in the developing solvent, the partially exposed film is typically heated at a temperature of from 50 to 250° C. for a period of from 0.1 to 10 minutes, alternatively heated at a temperature of from 100 to 200° C. for a period of from 1 to 10 minutes, alternatively heated at a temperature of from 115 to 150° C. for a period of from 1 to 4 minutes. Due to high selectivity between the exposed region and the non-exposed region of the specific developing solvent used in accordance with the present invention, the temperature required to substantially insolubilize the exposed region is lower than that required when conventional developing solvents are used. The specific developing solvent is described in further detail below. The partially exposed film can be heated using conventional equipment such as a hot plate or oven. Furthermore, exposure time defines the insolubilization of the exposed region for enabling the formation of a suitable pattern in the partially cured film due to the selectivity of the developing solvent.

The non-exposed region of the film is then removed with the developing solvent to reveal a film-free region on the substrate and to form the patterned film 30 including the exposed region that remains on the substrate. The developing solvent, which is also typically used as the EBR solvent, includes a siloxane component. The siloxane component includes a siloxane that has the following formula:

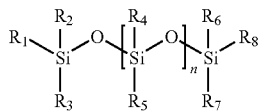

wherein $R_1$-$R_8$ are independently selected from the group of hydrogen, alkenyl groups, alkyl groups, phenyl groups, and combinations thereof, and n is from 0 to 100. The siloxane of the above formula typically has a number average molecular weight of from 162 to 8000 g/mol. In one embodiment, the siloxane component includes hexamethyldisiloxane, represented by the above formula when n=0 and $R_1$-$R_3$ and $R_6$-$R_8$ are each methyl groups. The siloxane component may further include at least one of octamethyltrisiloxane and decamethyltetrasiloxane, i.e., the siloxane component may include a mixture of hexamethyldisiloxane and either octamethyltrisiloxane or decamethyltetrasiloxane, or may include a mixture of hexamethyldisiloxane, octamethyltrisiloxane, and decamethyltetrasiloxane. It is to be appreciated that in some embodiments, the siloxane component may include the octamethyltrisiloxane and/or decamethyltetrasiloxane in the absence of hexamethyldisiloxane. Additionally, the siloxane component may include cyclic siloxanes, with or without the above siloxanes present in the siloxane component. However, mixtures of cyclic siloxanes and the siloxanes set forth above can also be used.

The hexamethyldisiloxane is typically present in an amount of at least 50 percent by volume based on the total volume of the siloxane component present in the developing solvent. More specifically, when the siloxane component comprises the mixture of hexamethyldisiloxane and at least one of octamethyltrisiloxane, decamethyltetrasiloxane, and/or cyclic siloxanes, the hexamethyldisiloxane is typically present in the amount of at least 50 percent by volume based on the total volume of the siloxane component. More typically, the hexamethyldisiloxane is present in an amount of at least 70 percent by volume based on the total volume of the siloxane component.

In addition to the siloxane component, the developing solvent may further include conventional hydrocarbon solvents having from 3 to 20 carbon atoms. These can include aliphatic hydrocarbon solvents including ketones, such as methyl ethyl ketone, methyl isobutyl ketone and methyl pentyl ketone; ethers, such as n-butyl ether and polyethylene glycol monomethylether; esters, such as ethyl acetate and y-butyrolactone; alkanes, such as nonane, decalin, and dodecane; and aromatic hydrocarbon solvents, such as mesitylene, xylene, and toluene. When the conventional hydrocarbon solvents are also present in the developing solvent, in addition to the siloxane component, the hexamethyldisiloxane is typically present in the developing solvent in an amount of at least 50 percent by volume, based on the total volume of all other solvents in the developing solvent. For example, when the siloxane component includes octamethyltrisiloxane, decamethyltetrasiloxane, and/or cyclic siloxanes in addition to the hexamethyldisiloxane, and the developing solvent further includes one or more of the conventional hydrocarbon solvents, the hexamethyldisiloxane is typically present in the developing solvent in an amount of at least 50 percent by volume based on the total volume of the developing solvent in order to obtain desired results for purposes of the present invention.

The non-exposed region can be removed by applying the developing solvent through any conventional method, including spraying, immersion, and pooling. Removal of the non-exposed region by pooling includes several steps. Typically, a dynamic rinse is applied with the developing solvent to remove the majority of non-exposed region of the film followed by puddle development which can range from 1 to 15 minutes, followed by another dynamic solvent rinse. Recipes typically contain a few repetitions of these steps. The developing solvent is typically used at a room temperature of about 21° C.

The patterned film 30 is then heated for an amount of time and at a temperature that is sufficient to cure the exposed region of the patterned film 30. Typically, the patterned film 30 is heated under conditions necessary to obtain maximum crosslink density in the exposed region without oxidation or decomposition. As such, the patterned film 30 is typically heated at a temperature of from 120 to 300° C. for a period of from 1 to 300 minutes, alternatively heated at a temperature of from 150 to 250° C. for a period of from 10 to 120 minutes, alternatively heated at a temperature of from 200 to 250° C. for a period of from 20 to 60 minutes. The patterned film 30 can be heated using conventional equipment such as a hot plate or oven in inert ambient, such as helium, nitrogen, argon, etc., or in ambient air.

Due to the presence of the siloxane component in the developing solvent, the film-free region is typically substantially free of residual silicone, i.e., scum, after developing using the developing solvent of the present invention. More specifically, by "substantially free of residual silicone", it is meant that the film-free region of the substrate is visually free of residual silicone under 100× magnification using a light microscope. Visual absence of the residual silicone on the film-free region of the substrate is readily apparent to those of skill in the art.

Without being bound to any particular theory, it is believed that the substantial absence of residual silicone is due to good solubility of the non-exposed region of the film in the developing solvent that includes the siloxane component and a relatively low boiling point of the siloxane component, which is dependent on the number average molecular weight of the siloxane component. The substantial absence of the residual silicone may also be attributable to good drying properties of the siloxane component while developing solvents having higher boiling point may smear out some of the residual silicone. The residual silicone is typically visually present under 100× magnification when conventional developing solvents, like Negative Resist Developer (NRD), are used and must subsequently be removed from the film-free region of the substrate.

Plasma etching using a fluorine-based plasma, such as $SF_6/O_2$, $CF_4$, $CHF_3$, $C_2F_6$, etc., is typically used to remove the residual silicone left on the film-free region. The fluorine-based plasma is relatively harsh to certain layers, such as the primary passivation, as compared to other types of plasma such as Ar, $Ar/O_2$, or $O_2$ plasma. When the substrate is the wafer 10 including the integrated circuit, the fluorine-based plasma has negative effects on the integrated circuit and, in particular, etches PECVD silicon nitride, which may be present on the substrate. Furthermore, if metal contacts are present on the substrate, contamination is possible when the fluorine-based plasma etching is used, and argon sputtering is often required to clean the metal contacts. The film-free region on the substrate, revealed in accordance with the method of the present invention using the developing solvent including the siloxane component, is substantially free of residual silicone without etching the film-free region with plasma. As such, the negative effects on associated with fluorine-based plasma etching may be completely avoided. Even so, some impurities may leach out of the patterned film 30 and form on the surface of film-free region during curing of the patterned film 30. The impurities are different than residual silicone. The impurities may be removed by etching with plasma, and the etching may be performed with an argon plasma with or without $O_2$ to avoid the negative effects associated with the fluorine-based plasma. However, it is to be appreciated that fluorine-based plasma may still be used to remove the remaining impurities. An article prepared in accordance with the method of the present invention and subjected to fluorine-based plasma etching typically requires no more than half of the etch time that is required for the article prepared using the conventional NRD developing solvent.

The thickness of the patterned film 30, after any etching, is typically from 0.05 to 200 μm, more typically from 1 to 50 μm, and most typically from 5 to 40 μm.

The following examples are meant to illustrate the present invention and are not to be viewed in any way as limiting.

EXAMPLES

Articles are prepared including a patterned film disposed on a substrate in accordance with the present invention. The patterned film is prepared from Dow Corning® WL5150 silicone composition by spin coating the silicone composition onto the substrate to form a film of the silicone composition. Articles are prepared with the film having a rim of about 16 um high, and an article is also prepared having a rim of about 40 um high in order to determine if film thickness has an effect on pattern formation when the articles are prepared in accordance with the method of the present invention. The spin speed and spin time are adjusted to obtain the specified thickness. Edge bead removal is performed using an EBR solvent including hexamethyldisiloxane present in an amount of about 100 percent by volume based on the total volume of the EBR solvent, commercially available from Dow Corning Corporation of Midland, Mich. A portion of the solvent in the silicone composition is then removed by heating the film at a temperature of about 110° C. for a period of about 2 minutes.

A portion of the film is then exposed to radiation to produce a partially exposed film having an exposed region and a non-exposed region. Broadband radiation is used at a dose of about 800 $mJ/cm^2$. The exposure to radiation is carried out with an EV aligner and proximity gap (distance between wafer and mask) of about 150 um. The EV aligner enables a sharp distinction between the exposed (cross-linked) region and the non-exposed region.

The partially exposed film is heated at a temperature of about 130° C. for a period of about 2 minutes to substantially insolubilize the exposed region in a developing solvent including hexamethyldisiloxane present in an amount of about 100 percent by volume based on the total volume of the developing solvent, commercially available from Dow Corning Corporation. The non-exposed region of the film is then removed with the developing solvent by puddle development to reveal a film-free region on the substrate and to form the patterned film that remains on the substrate. The patterned film is then heated at a temperature of about 250° C. for a period of about 30 minutes to cure the exposed region of the patterned film.

Some of the articles including the patterned film are etched with an $SF_6/O_2$ plasma for 90 seconds, instead of the 180 seconds that would be necessary when conventional developing solvents are used with the same process and tool set.

COMPARATIVE EXAMPLES

Comparative Examples of articles including a patterned film disposed on a substrate are made in the same manner as the Examples, except that a conventional developing solvent is used. The conventional developing solvent is NRD, which is a product of Air Products and Chemicals of Allentown, Pa. The conventional developing solvent is dynamically rinsed with iso-propyl alcohol to dry the patterned film on the substrate. Due to the presence of residual silicone left on the film-free region of the substrate after development when using the conventional developing solvents, the articles including the patterned film are etched with an $SF_6/O_2$ plasma for about 180 seconds to sufficiently remove the residual silicone from the film-free region.

Results

Due to transparency of the silicone composition in combination with the vertical light path, the exposure dose is not critical on a blanket wafer without underlying topography. The structures on the 16 um thick film and the 40 um thick film are exposed with the same exposure dose and subjected to the same post exposure bake, development time, and process. For the Examples prepared in accordance with the present invention, no visible residual silicone, or scum, remains on the film-free region under 100× magnification after development and before any plasma etching.

As for the Comparative Examples, visible residual silicone remains on the film-free region under 100× magnification after development and before any etching. Further, the articles require protracted etching that degrades exposed PECVD silicon nitride.

The invention has been described in an illustrative manner, and it is to be appreciated that the terminology which has been used is intended to be in the nature of words of description rather than of limitation. Obviously, many modifications and variations of the present invention are possible in view of the above teachings. It is, therefore, to be appreciated that within the scope of the claims the invention may be practiced otherwise than as specifically described.

What is claimed is:

1. A method of preparing a patterned film on a substrate, said method comprising the steps of:
    applying a silicone composition onto the substrate to form a film of the silicone composition;
    exposing a portion of the film to radiation to produce a partially exposed film having an exposed region and a non-exposed region;
    heating the partially exposed film for a sufficient amount of time and at a sufficient temperature to substantially insolubilize the exposed region in a developing solvent comprising a siloxane component with the non-exposed region remaining soluble in the developing solvent; and
    removing the non-exposed region of the partially exposed film with the developing solvent to reveal a film-free region on the substrate and to form the patterned film including the exposed region that remains on the substrate with the film-free region substantially free of residual silicone from the developing solvent due to the presence of the siloxane component in the developing solvent.

2. A method as set forth in claim 1 wherein the siloxane component includes a siloxane having the following formula:

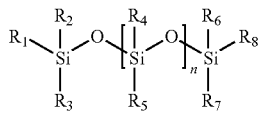

wherein $R_1$-$R_8$ are independently selected from the group of hydrogen, alkenyl groups, alkyl groups, phenyl groups, and combinations thereof, and n is from 0 to 100.

3. A method as set forth in claim 2 wherein the siloxane component has a number average molecular weight of from 162 to 8000 g/mol.

4. A method as set forth in claim 1 wherein the siloxane component comprises hexamethyldisiloxane.

5. A method as set forth in claim 4 wherein the siloxane component further comprises at least one of octamethyltrisiloxane and decamethyltetrasiloxane.

6. A method as set forth in claim 5 wherein the hexamethyldisiloxane is present in an amount of at least 50 parts by volume based on the total volume of the siloxane component present in the developing solvent.

7. A method as set forth in claim 6 wherein the hexamethyldisiloxane is present in the developing solvent in an amount of at least 50 parts by volume based on the total volume of the developing solvent.

8. A method as set forth in claim 4 wherein the siloxane component further comprises a cyclic siloxane.

9. A method as set forth in claim 1 where the radiation has a wavelength of from 150 to 450 nm.

10. A method as set forth in claim 1 further comprising the step of soft-baking the film of the silicone composition on the substrate.

11. A method as set forth in claim 1 further comprising the step of heating the patterned film for an amount of time and at a temperature sufficient to cure the exposed region in the patterned film.

12. A method as set forth in claim 11 further comprising the step of etching the patterned film with plasma.

13. A method as set forth in claim 1 further comprising the step of removing edge beads of the silicone composition from the substrate with the developing solvent comprising the siloxane component.

* * * * *